(12) United States Patent
Salama et al.

(10) Patent No.: US 8,962,485 B2
(45) Date of Patent: Feb. 24, 2015

(54) REUSING ACTIVE AREA MASK FOR TRENCH TRANSFER EXPOSURE

(71) Applicant: GLOBALFOUNDRIES Inc., Grand Cayman (KY)

(72) Inventors: Mohamed Salama, Poughkeepsie, NY (US); Tuhin Guha Neogi, Clifton Park, NY (US); Scott Beasor, Rhinebeck, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 13/897,890

(22) Filed: May 20, 2013

(65) Prior Publication Data
US 2014/0342556 A1 Nov. 20, 2014

(51) Int. Cl.
*H01L 21/311* (2006.01)
*H01L 21/283* (2006.01)

(52) U.S. Cl.
CPC .................................. *H01L 21/283* (2013.01)
USPC .... 438/700; 438/270; 438/197; 257/E29.133; 257/E29.156; 257/E21.006; 257/E21.027; 257/E21.058; 257/E21.165; 257/E21.166; 257/E21.296; 257/E21.487; 257/E21.499; 257/E21.546; 257/E21.585

(58) Field of Classification Search
USPC ........... 438/700, 270, 31, 197, 106, 243, 388, 438/430; 257/E21.006, E21.027, E21.058, 257/E21.165, E21.166, E21.296, E21.487, 257/E21.499, E21.546, E21.585, E29.133, 257/E29.156
See application file for complete search history.

(56) References Cited

U.S. PATENT DOCUMENTS

| | | | |
|---|---|---|---|
| 6,673,680 B2 * | 1/2004 | Calafut ......................... | 438/270 |
| 6,717,210 B2 * | 4/2004 | Takano et al. ................. | 257/330 |
| 6,838,735 B1 * | 1/2005 | Kinzer et al. ................. | 257/365 |
| 6,852,597 B2 * | 2/2005 | Park et al. ..................... | 438/268 |
| 6,969,888 B2 * | 11/2005 | Williams et al. .............. | 257/341 |
| 8,338,265 B2 | 12/2012 | Coolbaugh et al. | |
| 2010/0081225 A1 | 4/2010 | Song et al. | |

* cited by examiner

*Primary Examiner* — David Nhu
(74) *Attorney, Agent, or Firm* — Williams Morgan, P.C.

(57) ABSTRACT

A method of silicide formation in a semiconductor fabrication process is disclosed. An active area (RX) mask is used to form an active silicon area, and is then reused to form a trench transfer (TT) area. A trench block (TB) mask is logically ANDed with the active area (RX) mask to form a trench silicide (TS) region.

20 Claims, 4 Drawing Sheets

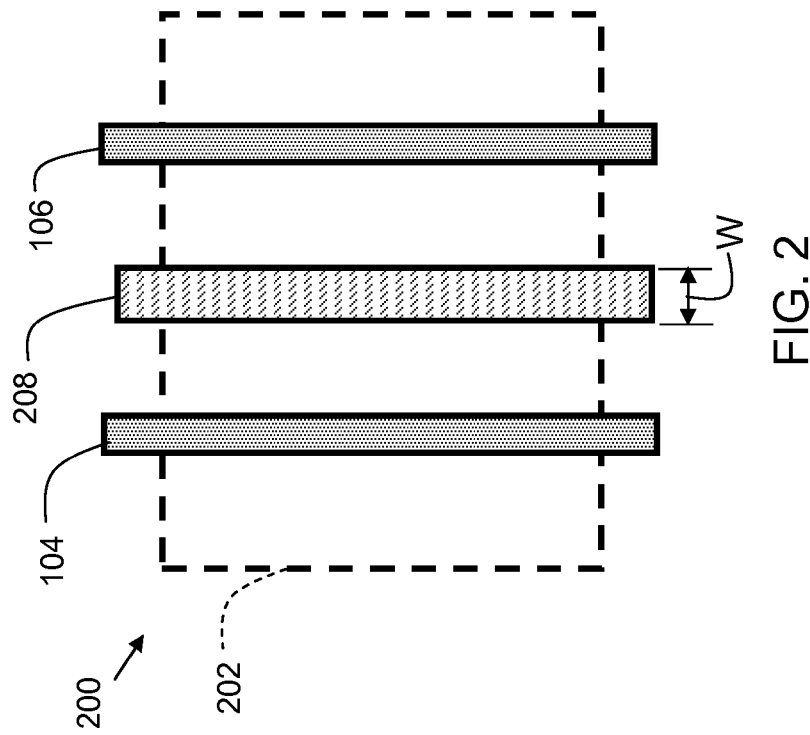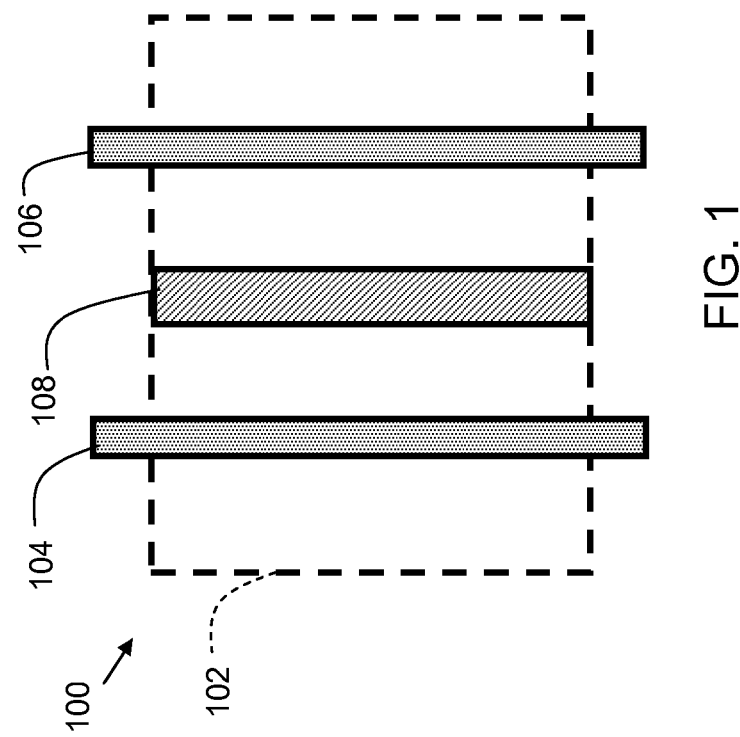

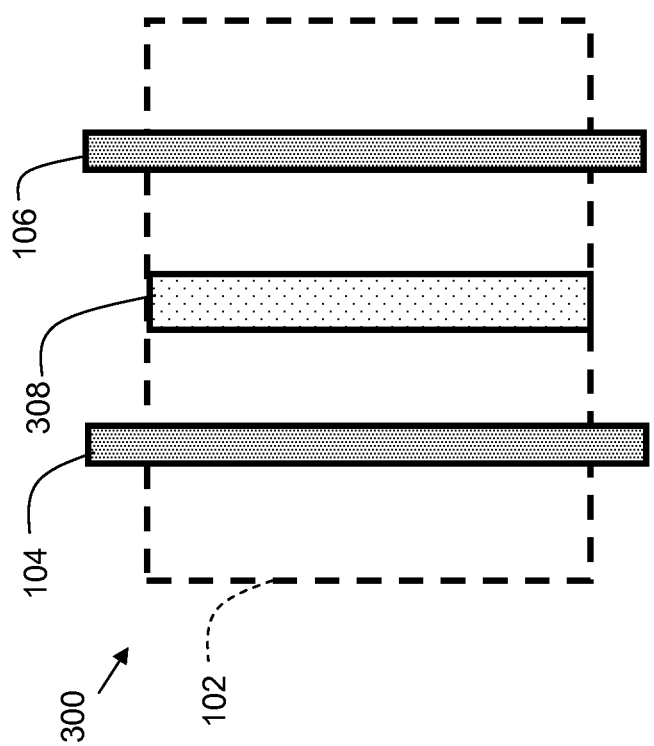

REUSING ACTIVE AREA MASK FOR TRENCH TRANSFER EXPOSURE

FIELD OF THE INVENTION

The present invention relates generally to semiconductor fabrication and, more particularly, to methods of forming silicide regions.

BACKGROUND

In designing an integrated circuit (IC), engineers typically rely upon computer simulation tools to help create a schematic circuit design consisting of individual circuit elements electrically coupled together in order to perform certain functions. To actually fabricate this integrated circuit in a semiconductor substrate, the circuit design must be translated into a physical representation, or layout, which itself can then be transferred onto a series of templates (e.g. masks) used to sequentially pattern layers in or on the semiconductor substrate surface. Electronic Design Automation (EDA) tools assist layout designers in the task of translating the circuit design into a series of two-dimensional patterns that will define the component layers of the IC, such as the active device regions, gate electrodes, contact holes, metal interconnections, and so on.

A method of transferring a layout pattern to the semiconductor substrate surface is to use the process of optical lithography (photolithography) in which the layout pattern is first transferred onto a physical template that in turn is used to optically project the layout pattern onto the surface of the semiconductor substrate (wafer).

In transferring the IC layout to physical templates, a mask is generally created for each layer of the IC. For example, the data representing the layout pattern for a specific layer (e.g. the gate electrode layer) can be input into an electron beam machine that writes the layout pattern onto a blank mask. After the mask is made, it is used to optically project the layout pattern onto many wafers, one at a time. This optical projection is done by shining light through the mask onto the wafer. Optical lenses and/or mirrors may be used to direct, demagnify, and/or focus the mask image onto the wafer surface. Prior to exposure, the wafer is first coated with a masking layer of photosensitive material that is resistant to being etched and is hence referred to as photoresist.

For a binary mask, light passes through the clear regions of the mask, thereby exposing the photoresist coating in these regions. In contrast, light is blocked by the opaque regions of the binary mask, thereby leaving the photoresist coating unexposed in these regions. When the photoresist coating is then developed in a chemical solution, either the exposed regions (for a positive photoresist) or unexposed regions (for a negative photoresist) are selectively removed. The end result is a wafer coated with a layer of photoresist exhibiting a desired pattern to define the geometries, features, lines, and shapes of an underlying layer or an overlying layer. The photoresist layer is then removed after the underlying layer is processed (e.g. etched) or after the overlying layer is deposited, respectively. This photolithography process is used to define each layer of the IC, generally using a separate mask for each layer.

With the increased density of semiconductor devices, the sheet resistivity of the electrically-conducting structures of these devices, such as the gate, drain and source regions of metal oxide semiconductor (MOS) transistors, the emitters of bipolar transistors, the local interconnect regions of MOS and bipolar transistors, and the interconnect lines connecting these devices together, is beginning to limit the speed at which semiconductor devices can operate.

One well-known technique for reducing the sheet resistivity of silicon structures is to form a layer of metal silicide over the silicon structure. The resulting silicided structures provide the lower resistivity of a metal silicide along with the well-known attributes of silicon. The silicide regions may be formed using a combination of masks as described above. The silicide regions play an important role in modern semiconductor devices. It is therefore desirable to have improved methods of silicide formation.

SUMMARY

A first aspect of the present invention provides a method of forming a semiconductor structure, comprising: forming an active silicon (RX) mask; forming a trench block (TB) mask; and forming a trench silicide (TS) region as a logical AND of the RX mask and the TB mask.

A second aspect of the present invention provides a method of forming a semiconductor structure, comprising: forming an active silicon area using an active silicon (RX) mask; forming a trench block (TB) mask; reusing the RX mask as a trench transfer (TT) mask; and forming a plurality of trench silicide (TS) regions as a logical AND of the RX mask and the TB mask.

A third aspect of the present invention provides a method of forming a semiconductor structure, comprising: forming an active silicon area using an active silicon (RX) mask; forming a trench block (TB) mask; reusing the RX mask as a trench transfer (TT) mask; and forming a plurality of trench silicide (TS) regions as a logical AND of the RX mask and the TB mask, wherein each TS region of the plurality of TS regions is disposed between two gate regions.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which:

FIG. 1 shows a trench silicide drawn layer in accordance with illustrative embodiments;

FIG. 2 shows a trench block mask in accordance with illustrative embodiments;

FIG. 3 shows a trench silicide region in accordance with illustrative embodiments;

DETAILED DESCRIPTION

Figure 4:
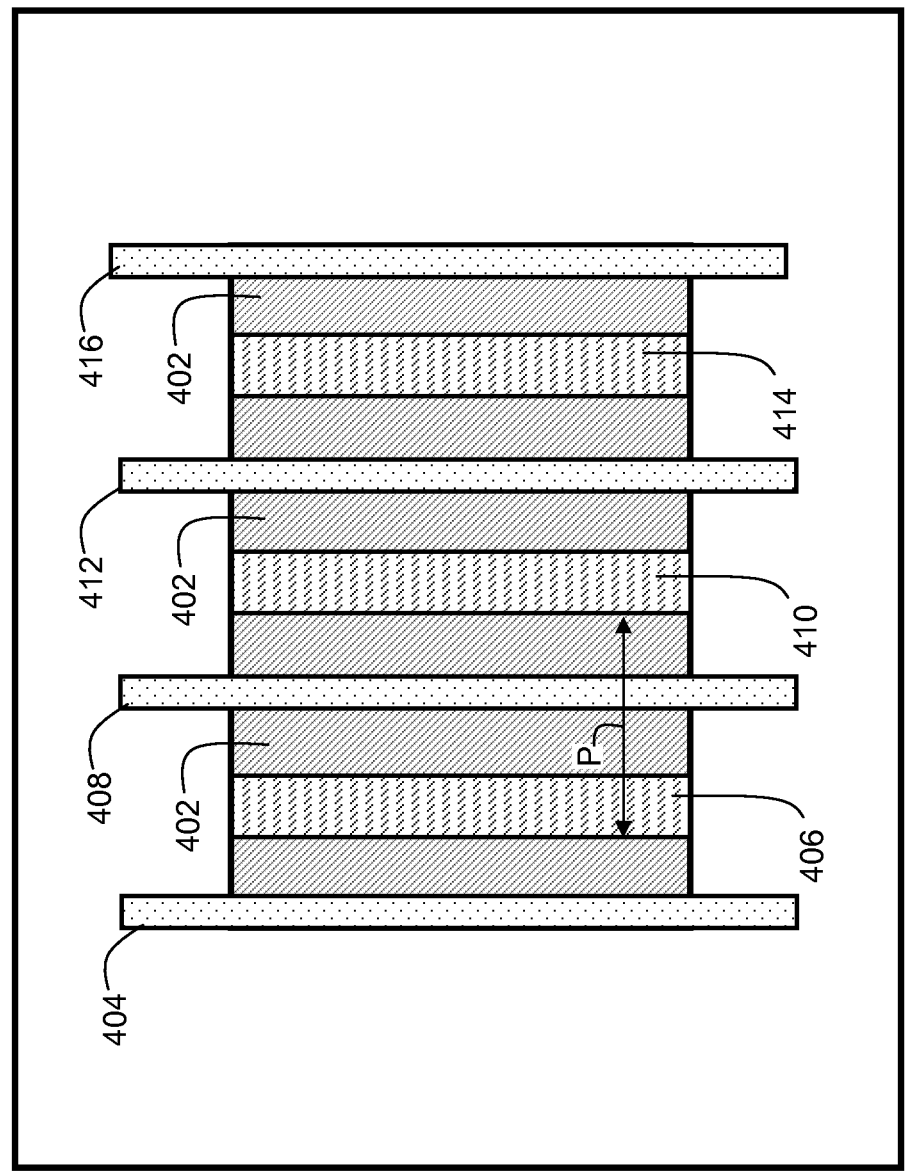
FIG. 4 shows a semiconductor structure in accordance with illustrative embodiments.

Exemplary embodiments will now be described more fully herein with reference to the accompanying drawings, in which exemplary embodiments are shown. Embodiments of the present invention provide an improved method of semiconductor fabrication. An active area (RX) mask is used to form an active silicon area, and is then reused to form a trench transfer (TT) area. A trench block (TB) mask is logically ANDed with the active area (RX) mask to form a trench silicide (TS) region.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element. The terms "mask" and "region" may be used interchangeably within this disclosure.

FIG. 1 shows a trench silicide drawn layer in accordance with illustrative embodiments. A semiconductor layout 100 indicates gate electrodes 104 and 106 on a drawn (designated) active (RX) region 102 of a substrate, being separated by a drawn trench silicide (TS) region 108. For the purposes of this disclosure, a drawn layer is a designed layer which is present in the incoming layout and/or design. A generated layer is not in the input design, but rather is generated based on other layers in the input layout. The drawn TS 108 may be used to form a silicide region on a semiconductor structure.

FIG. 2 shows a trench block mask in accordance with illustrative embodiments. A semiconductor layout 200 indicates gate electrodes 104 and 106 on a trench transfer (TT) 202 region of a substrate, being separated by a generated trench block (TB) mask 208. The trench block mask 208 extends above and below the trench transfer (TT) region 202. The mask may include a glass substrate with a patterned layer of chrome (Cr). Cr is not transparent to UV light which makes it possible to illuminate chosen areas of a substrate through the mask, a process referred to as photolithography. In some embodiments, the trench block mask 208 may be a bright field mask. In other embodiments, the trench block mask 208 may be a dark field mask. The field defines where the design database requires chrome to appear on the mask. If filled polygons in the design database represent chrome on the mask, the mask is "bright field" (sometimes referred to as "clear field"). In other words, the digitized data is dark. When the filled polygons of the database represent the clear areas of the mask, the mask is "dark field" (i.e. the digitized data is clear). In embodiments, the trench block (TB) mask 208 may have a width W ranging from about 40 nanometers to about 50 nanometers. In embodiments, the trench transfer region (TT) 202 may have a location and shape equivalent to the active area (RX) region (102 of FIG. 1), thus being an enabling component for allowing the active area mask to be reused in defining the trench transfer region. Hence, the same mask used for the active area (RX) region is reused for forming the trench transfer (TT) region. This can provide substantial cost savings for a semiconductor fabrication operation. The price of a TT mask may exceed $50,000. Hence, with multiple sites and re-spins, the overall savings can easily be hundreds of thousands of dollars.

FIG. 3 shows a trench silicide region in accordance with illustrative embodiments. A semiconductor layout 300 indicates gate electrodes 104 and 106 on the active area (RX) region 102, where the RX region 102 is equivalent to the trench transfer (TT) 202 region of a substrate. A drawn trench silicide (TS) region 308 is the logical AND of TT and TB, and since RX=TT, the trench silicide (TS) region 308 is therefore the logical AND of RX and TB. Hence, the trench block region 208 (see FIG. 2) extends above and below the active area (RX) region 102, as well as the trench transfer (TT) region 202.

FIG. 4 shows a semiconductor structure 400 in accordance with illustrative embodiments. Structure 400 comprises active silicon (RX) region 402. A plurality of gate electrodes (404, 408, 412, and 416) are disposed on active silicon (RX) region 402. A plurality of trench silicide regions (406, 410, and 414) are disposed on active silicon region 402. Each trench silicide region is disposed between two gate electrodes. Trench silicide region 406 is disposed between gate electrode 404 and gate electrode 408. Trench silicide region 410 is disposed between gate electrode 408 and gate electrode 412. Trench silicide region 414 is disposed between gate electrode 412 and gate electrode 416. The pitch P of the trench silicide regions is determined by the pitch of the trench block mask regions. In some embodiments, the trench silicide regions may be made from nickel, cobalt, and/or titanium, In some embodiments, the trench block (TB) mask pitch P ranges from about 90 nanometers to about 100 nanometers.

Figure 5:
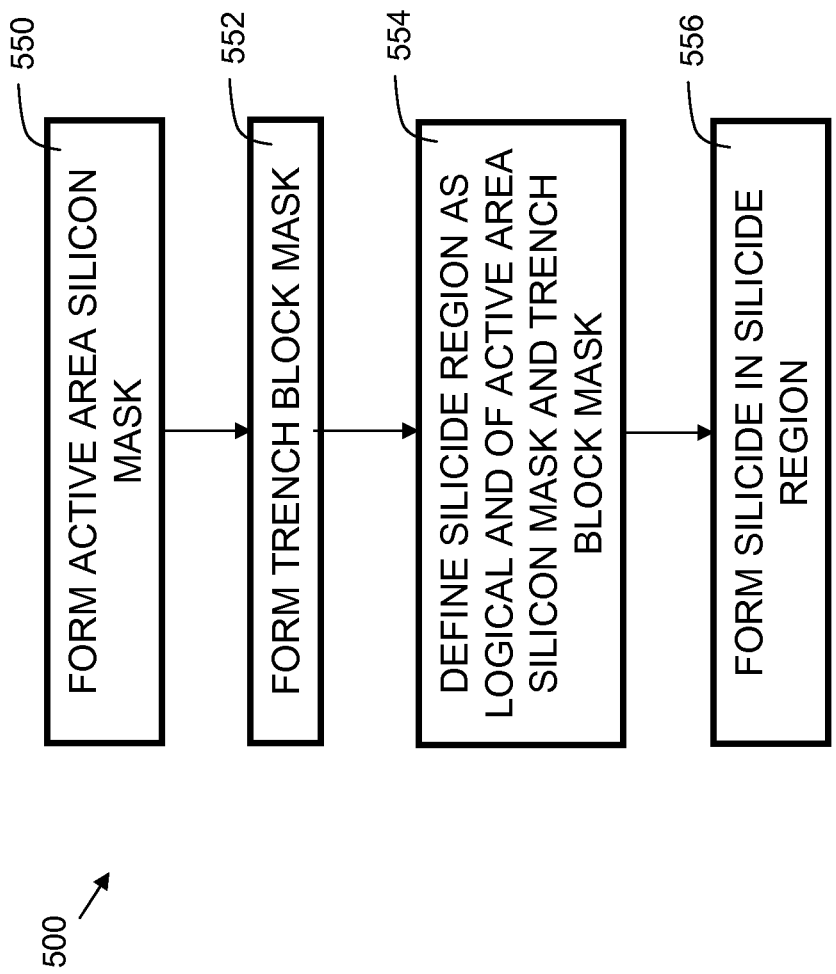
FIG. 5 is a flowchart indicating process steps for embodiments of the present invention.

FIG. 5 is a flowchart 500 indicating process steps for embodiments of the present invention. In process step 550, an active area silicon mask is formed. In process step 552, a trench block (TB) mask is formed. In process step 554, the silicide region is formed as the logical AND of the active area silicon mask and the trench block mask. In process step 556, silicide is formed in the silicide region. In embodiments, a trench is formed in a semiconductor substrate, and silicide may be formed in the trench.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, the method comprising:
   forming an active silicon (RX) mask;
   forming a trench block (TB) mask;
   reusing the RX mask as a trench transfer (TT) mask; and
   forming a trench silicide (TS) region as a logical AND of the RX mask and the TB mask.

2. The method of claim 1, wherein the TB mask extends above and below the RX mask.

3. The method of claim 1, wherein forming a TB mask comprises forming a bright field mask.

4. The method of claim 1, wherein forming a TB mask comprises forming a dark field mask.

5. The method of claim 1, wherein forming a TB mask comprises forming a TB mask having a width ranging from about 40 nanometers to about 50 nanometers.

6. The method of claim 1, further comprising:
   forming a second TB mask, wherein a TB mask pitch ranging from about 90 nanometers to about 100 nanometers is established.

7. The method of claim 1, wherein forming a trench silicide region comprises forming a trench silicide region comprising nickel.

8. The method of claim 1, wherein forming a trench silicide region comprises forming a trench silicide region comprising cobalt.

9. A method of forming a semiconductor structure, the method comprising:
   forming an active silicon area using an active silicon (RX) mask;
   forming a trench block (TB) mask;
   reusing the RX mask as a trench transfer (TT) mask; and
   forming a plurality of trench silicide (TS) regions as a logical AND of the RX mask and the TB mask.

10. The method of claim 9, wherein the TB mask extends above and below the RX mask.

11. The method of claim 9, wherein forming a TB mask comprises forming a bright field mask.

12. The method of claim 9, wherein forming a TB mask comprises forming a dark field mask.

13. The method of claim 9, wherein forming a plurality of trench silicide (TS) regions comprises forming each trench silicide (TS) region of the plurality of TS regions as having a width ranging from about 40 nanometers to about 50 nanometers.

14. The method of claim 9, wherein forming a plurality of trench silicide (TS) regions comprises forming trench silicide regions having a pitch ranging from about 90 nanometers to about 100 nanometers is established.

15. The method of claim 9, wherein forming a plurality of trench silicide (TS) regions comprises forming a plurality of trench silicide (TS) regions comprising nickel.

16. The method of claim 9, wherein forming a plurality of trench silicide (TS) regions comprises forming a plurality of trench silicide (TS) regions comprising cobalt.

17. A method of forming a semiconductor structure, the method comprising:
   forming an active silicon area using an active silicon (RX) mask;
   forming a trench block (TB) mask;
   reusing the RX mask as a trench transfer (TT) mask; and
   forming a plurality of trench silicide (TS) regions as a logical AND of the RX mask and the TB mask, wherein each TS region of the plurality of TS regions is disposed between two gate regions.

18. The method of claim 17, wherein forming a plurality of trench silicide (TS) regions comprises forming each trench silicide (TS) region of the plurality of TS regions as having a width ranging from about 40 nanometers to about 50 nanometers.

19. The method of claim 17, wherein forming a plurality of trench silicide (TS) regions comprises forming a plurality of trench silicide (TS) regions comprising nickel.

20. The method of claim 17, wherein forming a plurality of trench silicide (TS) regions comprises forming a plurality of trench silicide (TS) regions comprising cobalt.

* * * * *

UNITED STATES PATENT AND TRADEMARK OFFICE
CERTIFICATE OF CORRECTION

PATENT NO. : 8,962,485 B2  
APPLICATION NO. : 13/897890  
DATED : February 24, 2015  
INVENTOR(S) : Mohamed Salama, Tuhin Gua Neogi and Scott Beasor Page 1 of 1

It is certified that error appears in the above-identified patent and that said Letters Patent is hereby corrected as shown below:

In the Claims, please correct Claim 14 as follows:

- column 6, line 32, delete the words "is established" at the end of the sentence and place a --.-- after the word "nanometers."

Signed and Sealed this
Twenty-first Day of July, 2015

Michelle K. Lee
*Director of the United States Patent and Trademark Office*